(12) United States Patent
Hagi et al.

(10) Patent No.: US 12,377,484 B2
(45) Date of Patent: Aug. 5, 2025

(54) QUALITY DETERMINATION DEVICE AND QUALITY DETERMINATION METHOD

(71) Applicant: FUJI CORPORATION, Chiryu (JP)

(72) Inventors: Seijiro Hagi, Chiryu (JP); Shinji Naito, Anjo (JP); Takuro Mizukoshi, Okazaki (JP); Sota Sugiura, Hekinan (JP); Haruya Sakaguchi, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 155 days.

(21) Appl. No.: 18/548,699

(22) PCT Filed: Mar. 9, 2021

(86) PCT No.: PCT/JP2021/009246
§ 371 (c)(1),
(2) Date: Sep. 1, 2023

(87) PCT Pub. No.: WO2022/190200
PCT Pub. Date: Sep. 15, 2022

(65) Prior Publication Data
US 2024/0149363 A1     May 9, 2024

(51) Int. Cl.
*B23K 3/00*     (2006.01)
*B23K 3/06*     (2006.01)
(Continued)

(52) U.S. Cl.
CPC ............. *B23K 3/0623* (2013.01); *B23K 3/08* (2013.01); *H05K 13/0465* (2013.01); *H05K 13/083* (2018.08); *B23K 2101/40* (2018.08)

(58) Field of Classification Search
CPC .... B23K 3/0623; B23K 3/08; B23K 2101/40; B23K 35/0244; B23K 31/125;
(Continued)

(56) References Cited

U.S. PATENT DOCUMENTS

2002/0140949 A1* 10/2002 Sasaki .............. G01N 21/95684
                                                                       356/606
2005/0035182 A1* 2/2005 Mano .................. B23K 3/0607
                                                                        228/41
2022/0005720 A1* 1/2022 Zhang ................ H05K 13/0404

FOREIGN PATENT DOCUMENTS

CN       101494181 A  *  7/2009
JP         8-8523 A      1/1996
(Continued)

OTHER PUBLICATIONS

International Search Report mailed on Jun. 15, 2021 in PCT/JP2021/009246 filed on Mar. 9, 2021.

*Primary Examiner* — Kiley S Stoner
(74) *Attorney, Agent, or Firm* — Oblon, McClelland, Maier & Neustadt, L.L.P.

(57) ABSTRACT

A quality determination device is applied to a component mounter including a pallet and a suction nozzle, and includes a first determination section. The pallet includes supply units on which a solder ball group to be supplied to a target region, that is at least a part of a mounting area of a component to be mounted on a board is mounted. The solder ball group being disposed in accordance with electrode positions of the component. The suction nozzle picks up and holds a target object that is a supply unit or a solder ball group mounted on the supply unit, and supplies the target object to the target region of a board. The first determination section determines quality of the solder ball group mounted on at least one supply unit among the multiple supply units arranged in the pallet before the suction nozzle picks up the target object.

14 Claims, 5 Drawing Sheets

(51) Int. Cl.
*B23K 3/08* (2006.01)
*H05K 13/04* (2006.01)
*H05K 13/08* (2006.01)
*B23K 101/40* (2006.01)

(58) Field of Classification Search
CPC ............ H05K 13/0465; H05K 13/083; H05K 13/0813; H05K 2203/163; H05K 3/3478; H05K 2203/041; G01N 21/8806; G01N 2021/95646; H01L 24/11
USPC ........... 228/33, 41, 245–246, 8–12, 102–105
See application file for complete search history.

(56) References Cited

FOREIGN PATENT DOCUMENTS

| | | | | |
|---|---|---|---|---|
| JP | 2001-110933 A | | 4/2001 | |
| JP | 3549340 B2 | * | 8/2004 | |
| JP | 2005064205 A | * | 3/2005 | ........... B23K 3/0607 |
| KR | 101239322 B1 | * | 3/2013 | |
| KR | 20130028620 A | * | 3/2013 | |
| KR | 20130083531 A | * | 7/2013 | |
| TW | 202030810 A | * | 8/2020 | ......... G01N 21/8806 |
| WO | WO-2020070858 A1 | * | 4/2020 | ............ H04N 23/56 |

\* cited by examiner

QUALITY DETERMINATION DEVICE AND QUALITY DETERMINATION METHOD

TECHNICAL FIELD

The present description discloses a technique related to a quality determination device and a quality determination method.

BACKGROUND ART

The solder ball mounter described in Patent Literature 1 employs a tape structure in which multiple first solder balls are formed on a first principal surface side of an insulating tape and multiple second solder balls electrically connected to the first solder balls are respectively formed on a second principal surface side. The tape structure is mounted on multiple electrode pads of an insulating board for each tape structure, and after the tape structure is mounted, image processing for inspecting the mounted state is performed. As a result, the device described in Patent Literature 1 is designed to reduce the mounting failure of the solder balls.

PATENT LITERATURE

Patent Literature 1: JP-A-2001-110933

BRIEF SUMMARY

Technical Problem

A component mounter may include a pallet. In the pallet, supply units are arranged, the supply unit on which a solder ball group disposed in accordance with the electrode positions of a component is mounted. The suction nozzle picks up and holds a target object that is a supply unit or a solder ball group mounted on the supply unit, and supplies the target object to the target region of a board. In this case, when the suction nozzle picks up a target object including a defective solder ball group, it is necessary to handle the defective solder ball group after the target object is supplied, and the production efficiency may deteriorate.

In view of such a circumstance, the present description discloses a quality determination device and a quality determination method capable of suppressing the deterioration in production efficiency caused when picking up a target object including a defective solder ball group supplied from a pallet.

Solution to Problem

The present description discloses a quality determination device that is applied to a component mounter including a pallet and a suction nozzle, and that includes a first determination section. In the pallet, supply units are arranged, the supply unit on which a solder ball group that is multiple solder balls to be supplied to a target region that is at least a part of a mounting area of a component to be mounted on a board is mounted, the solder ball group being disposed in accordance with electrode positions of the component. The suction nozzle picks up and holds a target object that is the supply unit or the solder ball group mounted on the supply unit, and supplies the target object to the target region of the board. The first determination section determines the quality of the solder ball group mounted on at least one supply unit among the multiple supply units arranged in the pallet before the suction nozzle picks up the target object.

In addition, the present description discloses a quality determination method that is applied to a component mounter including a pallet and a suction nozzle, and that includes a first determination step. In the pallet, supply units are arranged, the supply unit on which a solder ball group that is multiple solder balls to be supplied to a target region that is at least a part of a mounting area of a component to be mounted on a board is mounted, the solder ball group being disposed in accordance with electrode positions of the component. The suction nozzle picks up and holds a target object that is the supply unit or the solder ball group mounted on the supply unit, and supplies the target object to the target region of the board. The first determination step determines the quality of the solder ball group mounted on at least one supply unit among the multiple supply units arranged in the pallet before the suction nozzle picks up the target object.

Advantageous Effects

According to the above-described quality determination device, it is possible to determine the quality of a solder ball group before a suction nozzle picks up a target object. Therefore, a component mounter can suppress a suction nozzle from picking up a target object including a defective solder ball group, and it is possible to suppress the deterioration in production efficiency caused when picking up the target object including the defective solder ball group supplied from a pallet. The above description of the quality determination device can be similarly applied to a quality determination method.

DESCRIPTION OF EMBODIMENTS

1. Embodiment

1-1. Example of Configuration of Component Mounter 10

Figure 1:
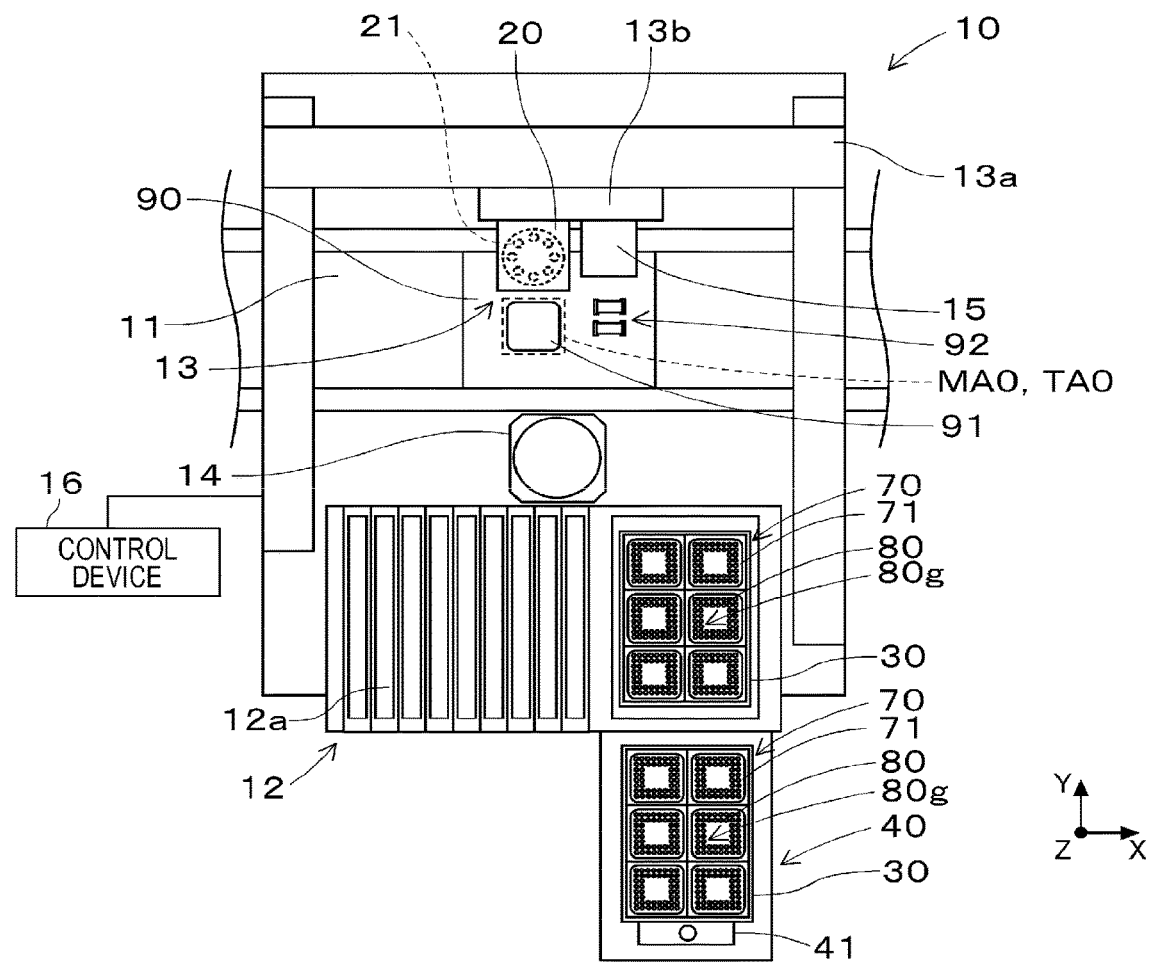
FIG. 1 is a plan view illustrating an example of a configuration of a component mounter.

Quality determination device 50 is applied to component mounter 10. Component mounter 10 mounts multiple mounting components 92 including component 91 on board 90. Component 91 is mounted on board 90 via solder ball 80. As illustrated in FIG. 1, component mounter 10 includes board conveyance device 11, supply device 12, transfer device 13, part camera 14, board camera 15, and control device 16.

For example, board conveyance device 11 includes a belt conveyor and the like, and conveys board 90 in a conveyance direction (X-axis direction). Board 90 is a circuit board, and various circuits such as an electronic circuit, an electric circuit, a magnetic circuit, and the like are formed thereon.

Board conveyance device 11 carries board 90 into component mounter 10, and positions and clamps board 90 at a predetermined position in component mounter 10. After the mounting processing of mounting component 92 by component mounter 10 is completed, board conveyance device 11 unclamps board 90, and carries out board 90 to the outside of component mounter 10.

Supply device 12 supplies mounting component 92. Supply device 12 may include feeder 12a provided along a conveyance direction (X-axis direction) of board 90. Feeder 12a pitch-feeds a carrier tape in which multiple chip components are housed to supply the chip components such that the chip components can be collected at a supply position located on the distal end side of feeder 12a. In addition, supply device 12 can supply relatively large-sized component 91 (for example, a component of a BGA (Ball Grid Array)) as compared with a chip component or the like in a state in which component 91 is disposed on pallet 30. Feeder 12a and pallet 30 are provided to be detachable (replaceable) from supply device 12.

Figure 2:
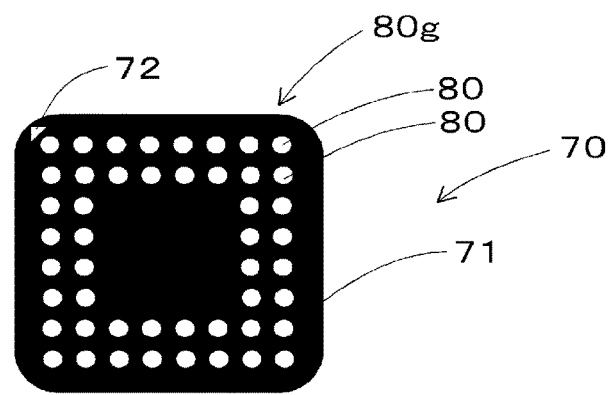
FIG. 2 is a plan view illustrating an example of a configuration of a supply unit.

Supply device 12 can also supply solder ball group 80g by using pallet 30. Multiple (six in FIG. 1) supply units 70 are arranged in pallet 30. As illustrated in FIGS. 1 and 2, each of multiple (six) supply units 70 mounts solder ball group 80g. Solder ball group 80g is multiple solder balls 80 supplied to target region TA0, which is a region of at least a part of mounting region MA0 of component 91 to be mounted on board 90, and is disposed in accordance with the electrode positions of component 91.

Specifically, supply unit 70 includes plate-shaped base member 71 on which solder ball group 80g is mountable. Multiple holes are formed in base member 71 in accordance with the electrode positions of component 91. The size of each of the multiple holes is formed to be slightly smaller than the size of solder ball 80 so that one solder ball 80 is mountable on one hole. As illustrated in FIG. 1, target region TA0 may be an entire region of mounting region MA0 of component 91. Target region TA0 may be at least one of divided regions in which mounting region MA0 is divided into multiple regions (for example, four).

Pallet 30 is moved in the Y-axis direction (direction orthogonal to the X-axis direction in the horizontal plane) by, for example, driving device 41. Driving device 41 pulls out pallet 30 used in the production of a board product from multiple pallets 30 housed in housing device 40, moves pallet 30 in the Y-axis direction, and installs pallet 30 in supply device 12. Driving device 41 can also move used pallet 30 used in the production of the board product in the Y-axis direction, and collect pallet 30 from supply device 12 to housing device 40.

Transfer device 13 includes head driving device 13a and moving table 13b. Head driving device 13a is configured to move moving table 13b in the X-axis direction and the Y-axis direction by a linear motion mechanism. Mounting head 20 is detachable (replaceable) from moving table 13b by a clamp member. Mounting head 20 uses at least one suction nozzle 21 to pick up and hold mounting component 92 supplied by supply device 12, and mounts mounting component 92 on board 90 positioned by board conveyance device 11.

A well-known imaging device can be used as part camera 14 and board camera 15. Part camera 14 is fixed to the base of component mounter 10 such that an optical axis faces upward in a vertical direction (in a Z-axis direction orthogonal to the X-axis direction and the Y-axis direction). Part camera 14 can image mounting component 92 held by suction nozzle 21 from below. Board camera 15 is provided on moving table 13b of transfer device 13 so that the optical axis is directed downward in the vertical direction (Z-axis direction). Board camera 15 can image board 90 from above.

Part camera 14 and board camera 15 perform imaging based on a control signal transmitted from control device 16. Image data of images captured by part camera 14 and board camera 15 is transmitted to control device 16. Control device 16 includes a well-known computing device and a storage device, and includes a control circuit. Information, image data, and the like output from various sensors provided in component mounter 10 are input to control device 16. Control device 16 transmits control signals to each device based on a control program, a predetermined mounting condition set in advance, and the like.

For example, control device 16 causes board camera 15 to image board 90 positioned by board conveyance device 11. Control device 16 performs image processing on the image captured by board camera 15 to recognize a positioning state of board 90. In addition, control device 16 causes suction nozzle 21 to pick up and hold mounting component 92 supplied by supply device 12, and causes part camera 14 to image mounting component 92 held by suction nozzle 21. Control device 16 performs image processing on the image captured by part camera 14 to recognize the holding posture of mounting component 92.

Control device 16 moves suction nozzle 21 above a planned mounting position set in advance by a control program or the like. In addition, control device 16 corrects the planned mounting position based on the positioning state of board 90, the holding posture of mounting component 92, and the like, and sets the mounting position at which mounting component 92 is actually mounted. The planned mounting position and the mounting position include a rotation angle in addition to the position (X-axis coordinate and Y-axis coordinate).

Control device 16 corrects the target position (X-axis coordinate and Y-axis coordinate) and the rotation angle of suction nozzle 21 in accordance with the mounting position. Control device 16 lowers suction nozzle 21 at the corrected rotation angle at the corrected target position, and mounts mounting component 92 on board 90. Control device 16 executes mounting processing for mounting multiple mounting components 92 on board 90 by repeating the pick-and-place cycle described above.

The above description of mounting component 92 can be similarly applied to target object TS0. Specifically, suction nozzle 21 picks up and holds target object TS0 that is the supply unit 70 or solder ball group 80g mounted on supply unit 70, and supplies target object TS0 to target region TA0 of board 90. Suction nozzle 21 is moved by mounting head 20 in the same manner as in the case of mounting component 92.

In a case where suction nozzle 21 picks up supply unit 70 (target object TS0 is supply unit 70), suction nozzle 21 picks up base member 71. Base member 71 is formed of an insulating material so that multiple solder balls 80 included in solder ball group 80g are electrically insulated from each other. In addition, in a case where suction nozzle 21 picks up solder ball group 80g mounted on supply unit 70 (target object TS0 is solder ball group 80g), multiple holes are formed in suction nozzle 21 in accordance with the electrode positions of component 91. Each of the multiple holes is formed to be slightly smaller than the size of solder ball 80 so that one solder ball 80 can be picked up by one hole.

1-2. Example of Configuration of Quality Determination Device 50

As described above, component mounter 10 may include pallet 30. In pallet 30, supply units 70 for mounting solder ball group 80g disposed in accordance with the electrode positions of component 91 are arranged. Suction nozzle 21 picks up and holds target object TS0 and supplies target object TS0 to target region TA0 of board 90. In this case, when suction nozzle 21 picks up target object TS0 including defective solder ball group 80g, it is necessary to handle defective solder ball group 80g after target object TS0 is supplied, and the production efficiency may be reduced.

Figure 3:
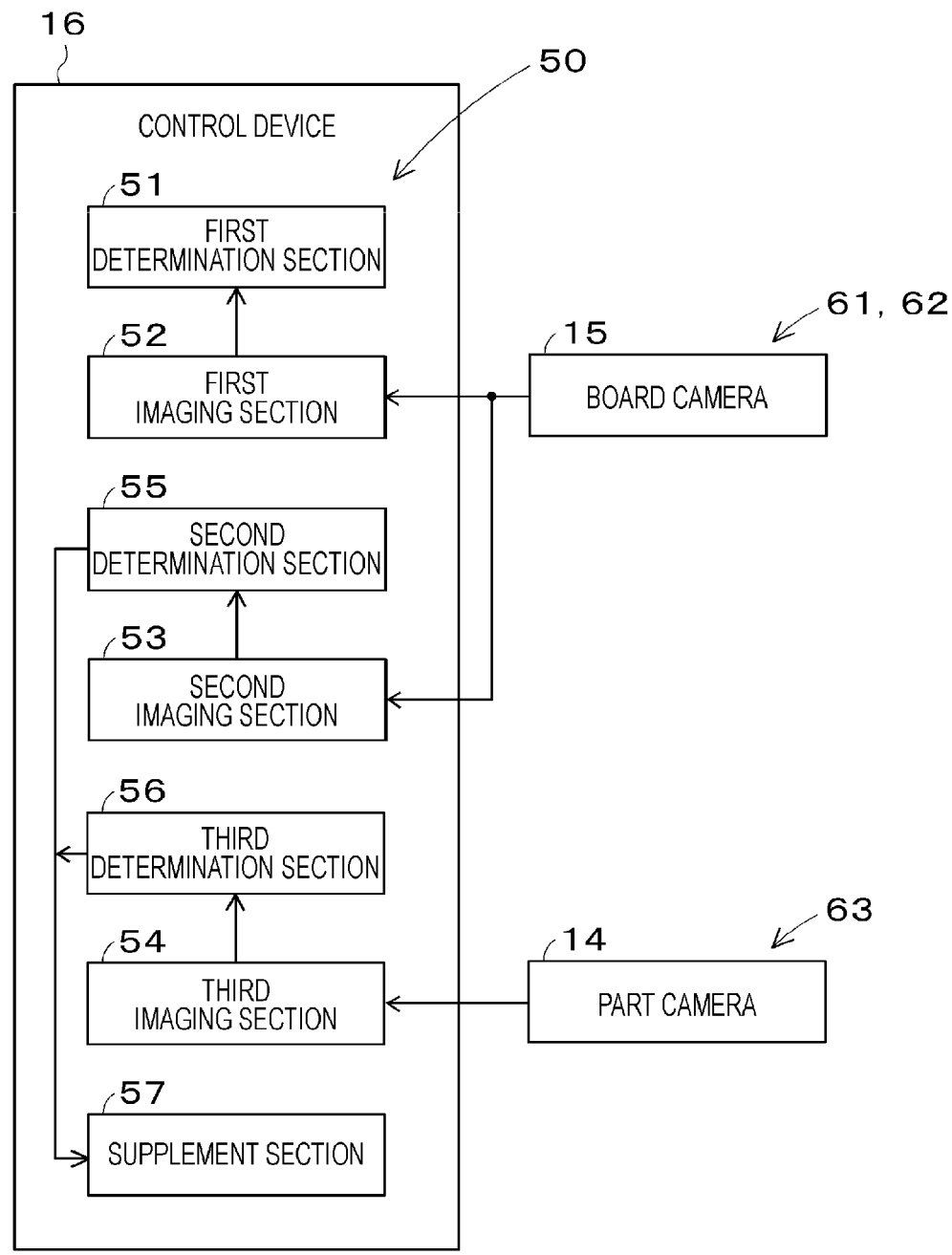
FIG. 3 is a block diagram illustrating an example of a control block of a quality determination device.

Therefore, quality determination device 50 is applied to component mounter 10 of the present embodiment. Quality determination device 50 includes first determination section 51. Quality determination device 50 may also include first imaging section 52. Quality determination device 50 may include at least second imaging section 53 among second imaging section 53 and third imaging section 54, and at least second determination section 55 among second determination section 55 and third determination section 56. Component mounter 10 may also include supplement section 57. As illustrated in FIG. 3, quality determination device 50 of the present embodiment includes first determination section 51, first imaging section 52, second imaging section 53, third imaging section 54, second determination section 55, and third determination section 56. In addition, control device 16 of component mounter 10 includes supplement section 57.

Quality determination device 50 can be provided on various control devices, management devices, clouds, or the like. As illustrated in FIG. 3, quality determination device 50 of the present embodiment is provided in control device 16 of component mounter 10. In addition, quality determination device 50 of the present embodiment executes control according to the flowchart illustrated in FIG. 4. First determination section 51 performs the processing illustrated in step S12. First imaging section 52 performs the processing illustrated in step S11. Second imaging section 53 performs the processing illustrated in step S17. Third imaging section 54 performs the processing illustrated in step S15. Second determination section 55 performs the processing illustrated in step S18. Third determination section 56 performs the processing illustrated in step S16. Supplement section 57 performs the determination illustrated in step S19 and the processing illustrated in step S20. Control device 16 of component mounter 10 performs the determination illustrated in step S13 and the processing illustrated in step S14.

1-2-1. First Determination Section 51 and First Imaging Section 52

First determination section 51 determines the quality of solder ball group 80g mounted on at least one supply unit 70 among multiple supply units 70 arranged in pallet 30 before suction nozzle 21 picks up target object TS0 (step S12).

First determination section 51 may determine the quality of solder ball group 80g, and may take various forms. First determination section 51 can also determine the quality of solder ball group 80g, for example, by using a well-known detection device for detecting solder ball group 80g mounted on supply unit 70. In the present embodiment, first determination section 51 determines the quality of solder ball group 80g based on image data PD0 of solder ball group 80g acquired by first imaging section 52.

First imaging section 52 causes first imaging device 61 to image solder ball group 80g mounted on at least one supply unit 70 among multiple supply units 70 arranged in pallet 30 (step S11). As first imaging device 61, a well-known imaging device can be used as long as solder ball group 80g can be imaged. As first imaging device 61, for example, board camera 15 can be used. Board camera 15 images solder ball group 80g mounted on base member 71 from above.

Figure 5:
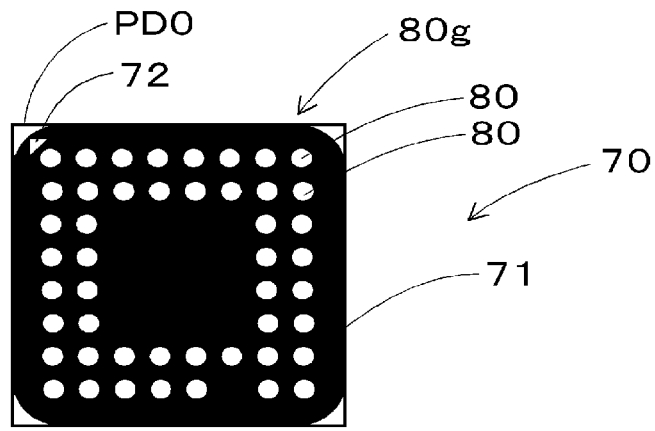
FIG. 5 is a schematic view illustrating an example of image data of a solder ball group.

FIG. 5 illustrates an example of image data PD0 of solder ball group 80g. FIG. 5 illustrates an example of image data PD0 captured when board camera 15 images solder ball group 80g mounted on base member 71 from above base member 71 of one supply unit 70 of pallet 30. As illustrated in FIGS. 2 and 5, multiple (47) solder balls 80 one less than the predefined number (48 in the example illustrated in FIG. 2) to be mounted on one supply unit 70 are captured in image data PD0.

For example, when the lid portion for covering pallet 30 is removed by an operator and pallet 30 is installed in housing device 40, solder balls 80 may adhere to the lid portion. Therefore, there may be supply unit 70 in which the number of solder balls 80 included in solder ball group 80g is less than the predefined number (48 in the above example).

Therefore, first determination section 51 determines that solder ball group 80g is good when the number of solder balls 80 included in solder ball group 80g recognized by performing the image processing on image data PD0 of solder ball group 80g matches the predefined number (48) to be mounted on supply unit 70. First determination section 51 determines that solder ball group 80g is defective when the number of solder balls 80 included in solder ball group 80g recognized by performing the image processing on image data PD0 of solder ball group 80g is less than the predefined number (48). In the example illustrated in FIG. 5, the number of solder balls 80 is less than the predefined number of solder balls 80 (48) by one. Therefore, in this case, first determination section 51 determines that solder ball group 80g is defective.

In addition, for example, in a case where supply units 70 are arranged in pallet 30 by the operator, supply units 70 different from supply unit 70 to be arranged may be arranged in pallet 30. Therefore, there may be supply unit 70 in which the size of each of solder balls 80 included in solder ball group 80g differs from the predetermined size of the solder balls to be mounted on supply unit 70.

Accordingly, first determination section 51 can also determine that solder ball group 80g is good when the size of each of solder balls 80 included in solder ball group 80g recognized by performing the image processing on image data PD0 of solder ball group 80g matches the predetermined size of solder balls to be mounted on supply unit 70. First determination section 51 can also determine that solder ball group 80g is defective when the size of at least one solder ball 80 included in solder ball group 80g recognized by performing the image processing on image data PD0 of solder ball group 80g differs from the predetermined size.

In addition, first determination section 51 can also determine that solder ball group 80g is good when the number of solder balls 80 included in solder ball group 80g matches the predefined number of the solder balls to be mounted on supply unit 70, and the size of each of solder balls 80 included in solder ball group 80g matches the predetermined size of the solder balls to be mounted on supply unit 70. First determination section 51 can also determine that solder ball group 80g is defective either when the number of solder balls 80 included in solder ball group 80g is less than the predefined number, or when the size of at least one solder ball 80 included in solder ball group 80g is different from the predetermined size.

The predefined number and the predetermined size of solder balls 80 to be mounted on supply unit 70 can be acquired from, for example, a management device that manages the production of the board product. Specifically, first determination section 51 can obtain information as to solder balls 80 matching the type of the board product to be manufactured by supplying solder ball group 80g from the management device to recognize the predefined number and the predetermined size of solder balls 80 to be mounted on the supply unit 70. The above description of the predefined number of solder balls 80 to be mounted on supply unit 70 can be similarly applied to second determination section 55 and third determination section 56 described later.

As described above, supply unit 70 includes plate-shaped base member 71 on which solder ball group 80g is mountable. As illustrated in FIG. 2, in the present embodiment, base member 71 is colored in a black color. In addition, white solder ball group 80g is mounted on base member 71. In this case, it is easy to recognize multiple solder balls 80 included in the solder ball group 80g by binarization processing. Therefore, first determination section 51 may binarize image data PD0 of white solder ball group 80g mounted on base member 71 colored in a black color to recognize each of solder balls 80 included in solder ball group 80g and determine the quality of solder ball group 80g.

In FIG. 1, for convenience of illustration, base member 71 is illustrated in white. In addition, even in a case where base member 71 is not colored in a black color, first determination section 51 can determine the quality of solder ball group 80g by binarizing image data PD0 of solder ball group 80g and recognizing each of solder balls 80 included in solder ball group 80g. In this case, it is preferable to lower the threshold value of the binarization processing as compared with a case where base member 71 is colored in a black color.

First imaging section 52 can cause first imaging device 61 to image solder ball group 80g mounted on each of the predetermined number of supply units 70 among multiple (six in the example illustrated in FIG. 1) supply units 70 arranged in pallet 30. The number of supply units 70 imaged by first imaging device 61 (the predetermined number described above) may be one or plural. In this case, first determination section 51 can determine the quality of solder ball group 80g for each of the predetermined number of supply units 70.

As described above, in the present embodiment, board camera 15 is used as first imaging device 61. For example, the predetermined number can be set according to the number of supply units 70 included in the imaging field of view of board camera 15. In addition, mounting head 20 can support multiple suction nozzles 21 capable of respectively picking up target objects TS0. In this case, the predetermined number may be set according to the number of target objects TS0 to be picked up in one pick-and-place cycle of mounting head 20.

As described above, supply unit 70 includes plate-shaped base member 71 on which solder ball group 80g is mountable. As illustrated in FIG. 2, base member 71 is provided with reference portion 72 used when recognizing mounted solder ball group 80g. Reference portion 72 is a positional reference when recognizing solder ball group 80g, and may take various forms. In the example illustrated in FIG. 2, reference portion 72 is a white triangle and is provided at one of the four corner portions of base member 71 having a substantially square shape.

Figure 6:
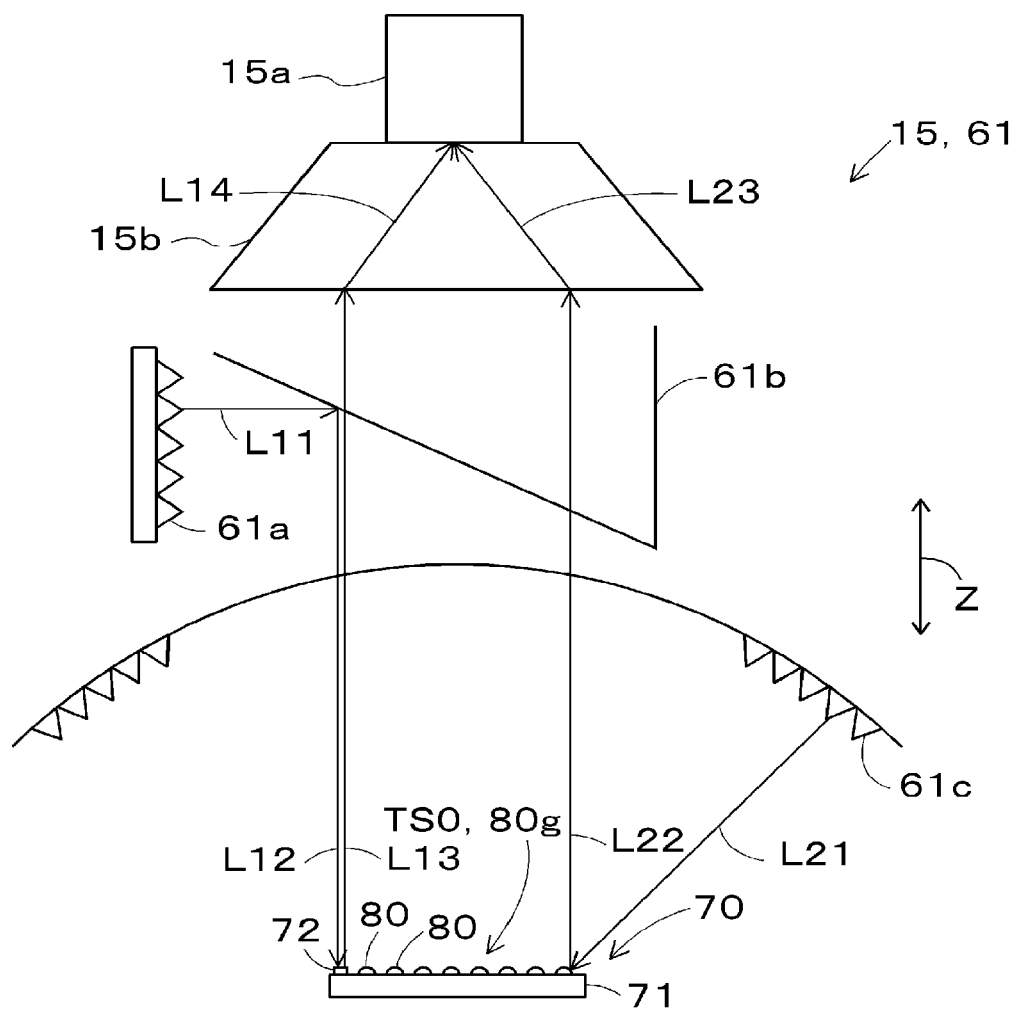
FIG. 6 is a side view illustrating an example of a configuration of a first imaging device.

In addition, reference portion 72 is often provided so as to be recognizable by being lighted by incident light, and solder ball group 80g is easily recognized by being lighted by oblique light. Therefore, as illustrated in FIG. 6, in the present embodiment, first imaging device 61 includes reference portion light source 61a, incident light converting section 61b, and solder ball group light source 61c. Reference portion light source 61a is a light source for lighting reference portion 72. Incident light converting section 61b converts the irradiation light emitted from reference portion light source 61a into incident light to light reference portion 72 from above in the vertical direction (Z-axis direction).

Solder ball group light source 61c lights solder ball group 80g from above obliquely inclined at a predetermined angle to the vertical direction (Z-axis direction). The predetermined angle is an angle capable of recognizing solder ball group 80g, and is set in advance by simulation, verification by an actual machine, or the like. A well-known light emitting diode can be used as reference portion light source 61a and solder ball group light source 61c for example, and the wavelength of the light to be emitted is not limited. Incident light converting section 61b can use, for example, a half mirror.

Reference portion light source 61a emits light toward incident light converting section 61b (arrow L11). The irradiation light emitted from reference portion light source 61a is reflected by incident light converting section 61b and travels toward reference portion 72 (arrow L12). The reflection angle is set to 90°. The irradiation light reflected by reference portion 72 travels toward lens 15b (arrow L13). The irradiation light reaching lens 15b passes through lens 15b and travels toward imaging element 15a (arrow L14).

In addition, solder ball group light source 61c emits light to solder ball group 80g from above obliquely inclined at a predetermined angle to the vertical direction (Z-axis direction) (arrow L21). The irradiation light reflected by solder ball group 80g travels toward lens 15b (arrow L22). The irradiation light reaching lens 15b passes through lens 15b and travels toward imaging element 15a (arrow L23). The above description of first imaging device 61 can be similarly applied to third imaging device 63 except for the emitting direction of the lighting.

As described above, first imaging section 52 acquires image data PD0 of reference portion 72 imaged by lighting reference portion 72 by using reference portion light source 61a and incident light converting section 61b, and image data PD0 of solder ball group 80g imaged by lighting solder ball group 80g by using solder ball group light source 61c, respectively. In this case, first determination section 51 can determine the quality of solder ball group 80g by recognizing each of solder balls 80 included in solder ball group 80g with reference to reference portion 72 based on image data PD0 of reference portion 72 and image data PD0 of solder ball group 80g.

In a case where it is determined by first determination section 51 that solder ball group 80g is good (Yes in step S13 illustrated in FIG. 4), control device 16 of component mounter 10 causes suction nozzle 21 to pick up target object TS0 including solder ball group 80g determined to be good (step S14).

Figure 4:
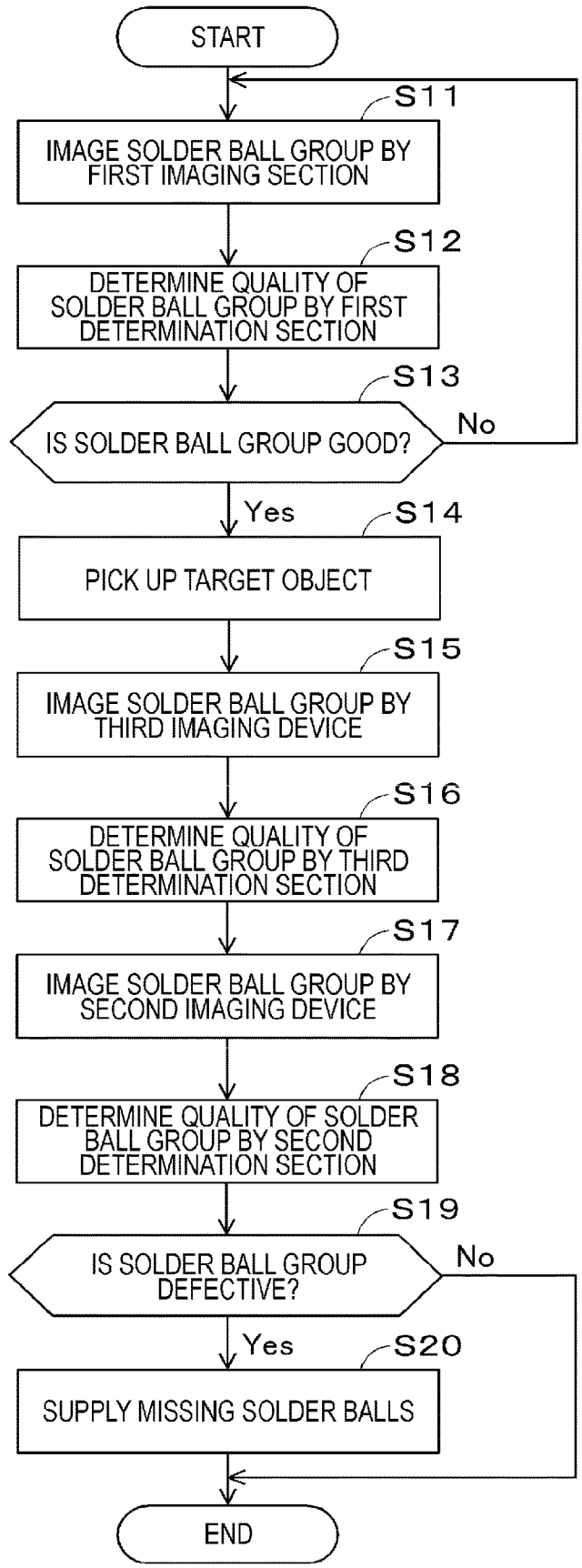
FIG. 4 is a flowchart illustrating an example of a control procedure performed by the quality determination device.

As in the present embodiment, it is assumed that first imaging section 52 causes first imaging device 61 to image solder ball group 80g mounted on supply unit 70 for each supply unit 70. In a case where it is determined by first determination section 51 that solder ball group 80g is defective (No in step S13), the control returns to the processing illustrated in step S11, as illustrated in FIG. 4. First imaging section 52 causes first imaging device 61 to image solder ball group 80g mounted on another supply unit 70 (step S11). The processing and the determination illustrated in steps S11 to S13 are repeated until first determination section 51 determines that solder ball group 80g is good.

In addition, it is assumed that first imaging section 52 causes first imaging device 61 to image solder ball group 80g mounted on supply unit 70 for each of multiple supply units 70. In a case where it is determined by first determination section 51 that solder ball group 80g is defective (No in step S13), the control returns to the processing illustrated in step S12. First determination section 51 determines the quality of solder ball group 80g mounted on another supply unit 70 (step S12). In a case where there is no good solder ball group 80g, the control returns to the processing illustrated in step S11. The processing and the determination illustrated in steps S11 to S13 are repeated until first determination section 51 determines that solder ball group 80g is good.

1-2-2. Second Imaging Section 53, Third Imaging Section 54, Second Determination Section 55, and Third Determination Section 56

Suction nozzle 21 picks up and holds target object TS0 and supplies target object TS0 to target region TA0 of board 90. For example, target object TS0 may fall on the way target object TS0 is supplied to target region TA0 of board 90. Therefore, quality determination device 50 may include at least second imaging section 53 among second imaging section 53 and third imaging section 54, and at least second determination section 55 among second determination section 55 and third determination section 56.

Second imaging section 53 causes second imaging device 62 to image solder ball group 80g of target object TS0 supplied to target region TA0 of board 90 by suction nozzle 21 (step S17 illustrated in FIG. 4). It is sufficient if second imaging device 62 can image solder ball group 80g of target object TS0 supplied to target region TA0, and a well-known imaging device can be used. As second imaging device 62, for example, board camera 15 can be used.

In this case, board camera 15 images solder ball group 80g of target object TS0 supplied to target region TA0 from above. As described above, board camera 15 is provided in transfer device 13 that moves mounting head 20 including suction nozzle 21. As described above, second imaging device 62 is provided in transfer device 13 that moves mounting head 20 including suction nozzle 21, and can also serve as first imaging device 61.

In a case where target object TS0 is solder ball group 80g, an area reference portion similar to reference portion 72 provided on base member 71 is provided in target region TA0 of board 90. In the description of second imaging device 62 in this case, in the description of first imaging device 61, reference portion 72 may be replaced with a region reference portion, and duplicate descriptions thereof are omitted in the present description. In addition, second imaging section 53 can cause second imaging device 62 to image solder ball group 80g for each target region TA0. In addition, second imaging section 53 can cause second imaging device 62 to image solder ball group 80g for each of multiple target regions TA0.

Third imaging section 54 causes third imaging device 63 to image solder ball group 80g of target object TS0 held by suction nozzle 21 (step S15). It is sufficient if third imaging device 63 can image solder ball group 80g of target object TS0 held by suction nozzle 21, and a well-known imaging device can be used. As third imaging device 63, for example, part camera 14 can be used.

In this case, part camera 14 images solder ball group 80g of target object TS0 held by suction nozzle 21 from below. As described above, part camera 14 is fixed to the base of component mounter 10. As described above, third imaging device 63 is fixed to the base of component mounter 10, and can image solder ball group 80g of target object TS0 held by suction nozzle 21 from below.

Figure 7:
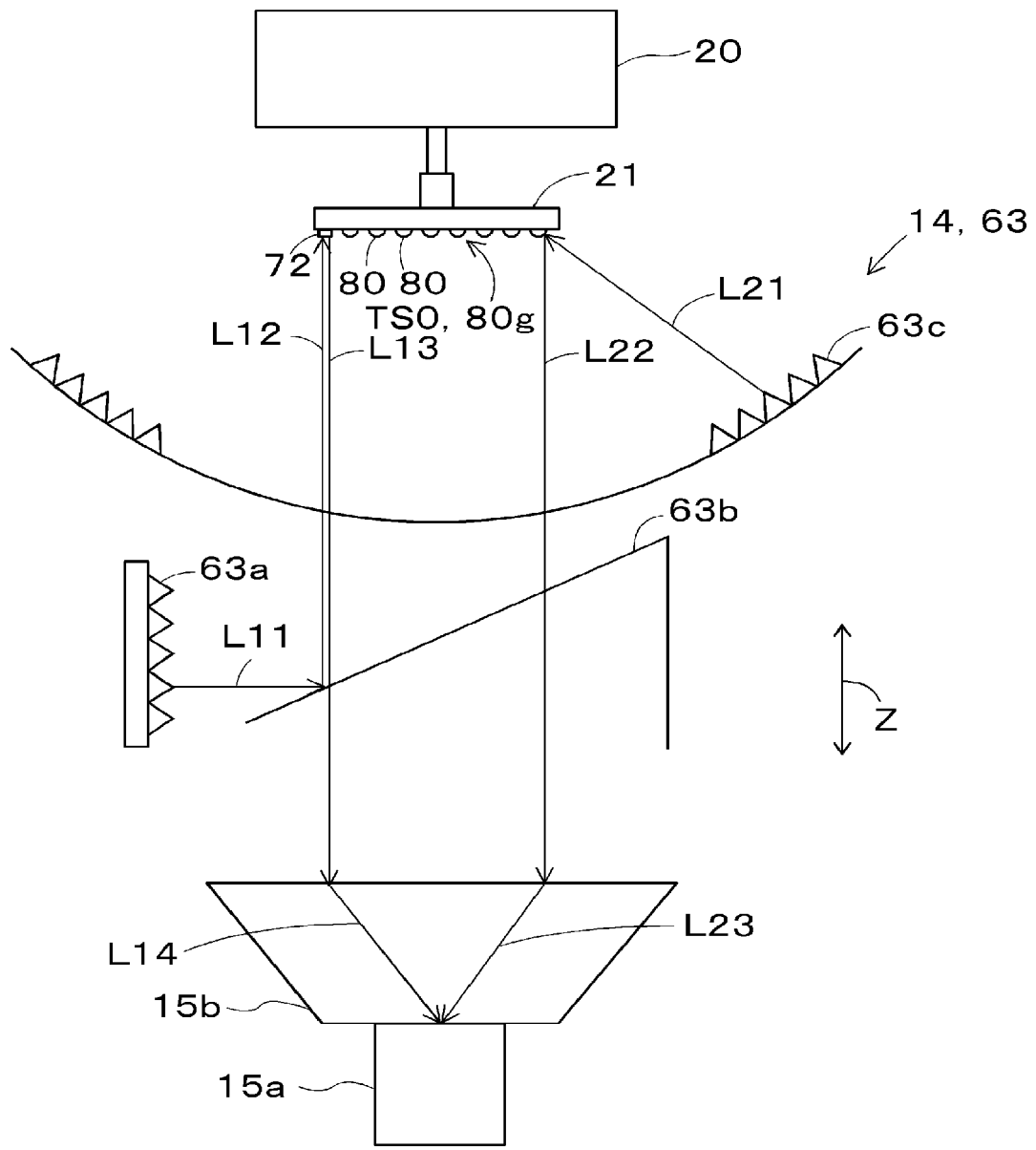
FIG. 7 is a side view illustrating an example of a configuration of a third imaging device.

In third imaging device 63, in a case where target object TS0 is supply unit 70, reference portion 72 is provided on the surface of base member 71 on the side facing third imaging device 63. In a case where target object ISO is solder ball group 80g, reference portion 72 is provided on suction nozzle 21 or mounting head 20. As illustrated in FIG. 7, third imaging device 63 differs from first imaging device 61 in the emitting direction of the lighting. Specifically, third imaging device 63 includes reference portion light source 63a, incident light converting section 63b, and solder ball group light source 63c, similarly to first imaging device 61.

However, incident light converting section 63b of third imaging device 63 converts the irradiation light emitted from reference portion light source 63a into incident light to light reference portion 72 from below in the vertical direction (Z-axis direction). Solder ball group light source 63c of third imaging device 63 lights solder ball group 80g from below obliquely inclined by a predetermined angle with respect to the vertical direction (Z-axis direction). Third imaging section 54 acquires image data PD0 of reference portion 72 captured by lighting reference portion 72 by using reference portion light source 63a and incident light converting section 63b, and image data PD0 of solder ball group 80g captured by lighting solder ball group 80g by using solder ball group light source 63c, respectively.

In a case where mounting head 20 supports multiple suction nozzles 21, third imaging section 54 can cause third imaging device 63 to image solder ball group 80g of target object TS0 for each suction nozzle 21. In addition, third imaging section 54 can cause third imaging device 63 to image solder ball group 80g of target object TS0 for each of multiple suction nozzles 21.

Second determination section 55 is provided in a case where quality determination device 50 includes second imaging section 53. Second determination section 55 determines the quality of solder ball group 80g of target object TS0 after being supplied to target region TA0 based on image data PD0 of solder ball group 80g acquired by second imaging section 53 (step S18). Second determination section 55 can determine the quality of solder ball group 80g in the same manner as first determination section 51.

Second determination section 55 determines that solder ball group 80g is good when the number of solder balls 80 included in solder ball group 80g recognized by performing the image processing on image data PD0 of solder ball group 80g matches the predefined number (48 in the above-described example) of the solder balls to be supplied to target region TA0. Second determination section 55 determines that solder ball group 80g is defective when the number of solder balls 80 included in solder ball group 80g recognized by performing the image processing on image data PD0 of solder ball group 80g is less than the predefined number (48).

Third determination section 56 is provided in a case where quality determination device 50 includes third imaging section 54. Third determination section 56 determines the quality of solder ball group 80g of target object TS0 before being supplied to target region TA0 based on image data PD0 of solder ball group 80g acquired by third imaging section 54 (step S16). The above description of second determination section 55 can be similarly applied to third determination section 56.

In addition, second imaging section 53 can cause second imaging device 62 to image solder ball group 80g of target object TS0 for each of the predetermined number of target regions TA0, and second determination section 55 can determine the quality of solder ball group 80g for each of the predetermined number of target regions TA0. Similarly, third imaging section 54 can cause third imaging device 63 to image solder ball group 80g of target object TS0 for each target object TS0 held by the predetermined number of suction nozzles 21, and third determination section 56 can determine the quality of solder ball group 80g for each of target objects TS0 held by the predetermined number of suction nozzles 21.

In addition, since solder ball group 80g may be defective after solder ball group 80g is imaged by third imaging section 54, quality determination device 50 may include at least second imaging section 53 among second imaging section 53 and third imaging section 54, and at least second determination section 55 among second determination section 55 and third determination section 56.

1-2-3. Supplement Section 57

When at least second determination section 55 among second determination section 55 and third determination section 56 determines that solder ball group 80g is defective, supplement section 57 supplies missing solder balls 80 to target region TA0 (Yes in step S19 and step S20 illustrated in FIG. 4).

For example, supplement section 57 supplies missing solder balls 80 to target region TA0 by using suction nozzle 21 capable of picking up one solder ball 80. Specifically, supplement section 57 moves mounting head 20 to cause suction nozzle 21 to pick up and hold one solder ball 80 from an accommodation case accommodating multiple solder balls 80. Supplement section 57 moves mounting head 20 to supply solder ball 80 to a region (missing region) of target region TA0 to which solder ball 80 is not supplied.

In a case where there are multiple missing regions in one target region TA0, supplement section 57 repeats the above-described supplement processing. In a case where mounting head 20 supports multiple suction nozzles 21, supplement section 57 can also cause suction nozzle 21 capable of picking up one solder ball 80 to pick up solder ball 80 in advance.

In addition, it is assumed that board 90 is subsequently conveyed to multiple component mounters 10 such that multiple mounting components 92 including component 91 are mounted. In this case, in component mounter 10 that has supplied target object TS0 to target region TA0, supplement section 57 can supply missing solder balls 80 to target region TA0. In addition, supplement section 57 can also supply missing solder balls 80 to target region TA0 in component mounter 10 at a later stage than component mounter 10 that has supplied target object TS0 to target region TA0. In this case, the supply processing and the supplement processing of solder balls 80 can be dispersed. In addition, supplement section 57 can collectively supply solder balls 80 in the component mounter at a later stage than component mounter 10 in the multiple missing regions in multiple component mounters 10.

It is assumed that quality determination device 50 includes third imaging section 54 and third determination section 56 and solder ball group 80g is defective before solder ball group 80g is imaged by third imaging section 54. In this case, before second determination section 55 determines that solder ball group 80g is defective, there is a high possibility that third determination section 56 determines that solder ball group 80g is defective. Therefore, supplement section 57 can initiate preparation of the supplement processing when third determination section 56 determines that solder ball group 80g is defective. For example, in a case where mounting head 20 supports multiple suction nozzles 21, supplement section 57 can cause suction nozzle 21 capable of picking up one solder ball 80 to pick up solder ball 80 in advance. Supplement section 57 can also initiate the supplement processing after second imaging section 53 images solder ball group 80g and before second determination section 55 determines the quality of solder ball group 80g.

1-3. Quality Determination Method

The above description of quality determination device 50 can be similarly applied to a quality determination method. Specifically, the quality determination method includes a first determination step. The first determination step corresponds to the control performed by first determination section 51. The quality determination method may include a first imaging step. The first imaging step corresponds to the control performed by first imaging section 52. The quality determination method may also include at least a second imaging step among the second imaging step and a third imaging step, and at least a second determination step among the second determination step and a third determination step. The second imaging step corresponds to the control performed by second imaging section 53. The third imaging step corresponds to the control performed by third imaging section 54. The second determination step corresponds to the control performed by second determination section 55. The third determination step corresponds to the control performed by third determination section 56. In addition, the control by component mounter 10 may include a supplement step. The supplement step corresponds to the control performed by supplement section 57.

2. Example of Effects of Embodiment

According to quality determination device 50, before suction nozzle 21 picks up target object TS0, it is possible to determine the quality of solder ball group 80g. Therefore, component mounter 10 can suppress suction nozzle 21 from picking up target object ISO including defective solder ball group 80g, and it is possible to suppress the deterioration in the production efficiency caused when picking up of target object TS0 including defective solder ball group 80g supplied from pallet 30. The above description of quality determination device 50 can be similarly applied to the quality determination method.

REFERENCE SIGNS LIST

10: component mounter, 13: transfer device, 20: mounting head, 21: suction nozzle, 30: pallet, 50: quality determination device, 51: first determination section, 52: first imaging section, 53: second imaging section, 54: third imaging section, 55: second determination section, 56: third determination section, 57: supplement section, 61: first imaging device, 61a: reference portion light source, 61b: incident light converting section, 61c: solder ball group light source, 62: second imaging device, 63: third imaging device, 70: supply unit, 71: base member, 72: reference portion, 80: solder ball, 80g: solder ball group, 90: board, 91: component, 92: mounting component, PD0: image data, MA0: mounting area, TA0: target region, TS0: target object, Z-axis direction: vertical direction

The invention claimed is:

1. A quality determination device applied to a component mounter including
a pallet in which supply units are arranged, the supply unit on which a solder ball group that is multiple solder balls to be supplied to a target region that is at least a part of a mounting area of a component to be mounted on a board is mounted, the solder ball group being disposed in accordance with electrode positions of the component, and
a suction nozzle configured to pick up and hold a target object that is the supply unit or the solder ball group mounted on the supply unit and supply the target object to the target region of the board, the quality determination device comprising:
a first determination section configured to determine quality of the solder ball group mounted on at least one supply unit among multiple supply units arranged in the pallet before the suction nozzle picks up the target object.

2. The quality determination device according to claim 1, further comprising:
a first imaging section configured to cause a first imaging device to image the solder ball group mounted on the at least one supply unit among the multiple supply units arranged in the pallet, wherein
the first determination section determines the quality of the solder ball group based on image data of the solder ball group acquired by the first imaging section.

3. The quality determination device according to claim 2, wherein
the first determination section determines that the solder ball group is good when the number of the solder balls included in the solder ball group recognized by performing image processing on the image data of the solder ball group matches a predefined number of the solder balls to be mounted on the supply unit, and determines that the solder ball group is defective when the number of the solder balls included in the recognized solder ball group is less than the predefined number.

4. The quality determination device according to claim 2, wherein
the first determination section determines that the solder ball group is good when a size of each of the solder balls included in the solder ball group recognized by performing image processing on the image data of the solder ball group matches a predetermined size of the solder balls to be mounted on the supply unit, and determines that the solder ball group is defective when the size of at least one solder ball included in the recognized solder ball group differs from the predetermined size.

5. The quality determination device according to claim 2, wherein
the supply unit includes a plate-shaped base member on which the solder ball group is mountable, and
the first determination section determines the quality of the solder ball group by binarizing image data of the white solder ball group mounted on the base member colored in a black color and recognizing each of the solder balls included in the solder ball group.

6. The quality determination device according to claim 2, wherein
the first imaging section causes the first imaging device to image the solder ball group mounted for each of a predetermined number of the supply units among the multiple supply units arranged in the pallet, and
the first determination section determines the quality of the solder ball group for each of the predetermined number of the supply units.

7. The quality determination device according to claim 2, wherein
the supply unit includes a plate-shaped base member on which the solder ball group is mountable,
the base member is provided with a reference portion to be used when recognizing the mounted solder ball group,
the first imaging device includes
a reference portion light source configured to light the reference portion,
an incident light converting section configured to convert irradiation light emitted from the reference portion light source into incident light to light the reference portion from above in a vertical direction, and
a solder ball group light source configured to light the solder ball group from above obliquely inclined at a predetermined angle to the vertical direction,
the first imaging section acquires image data of the reference portion imaged by lighting the reference portion by using the reference portion light source and the incident light converting section, and image data of the solder ball group imaged by lighting the solder ball group by using the solder ball group light source, and
the first determination section determines the quality of the solder ball group by recognizing each of the solder balls included in the solder ball group with reference to the reference portion based on the image data of the reference portion and the image data of the solder ball group.

8. The quality determination device according to claim 2, wherein
the quality determination device includes
at least a second imaging section configured to cause a second imaging device to image the solder ball group of the target object supplied to the target region of the board by the suction nozzle among the second imaging section and a third imaging section configured to cause a third imaging device to image the solder ball group of the target object held by the suction nozzle, and at least a second determination section configured to determine the quality of the solder ball group of the target object after being supplied to the target region based on image data of the solder ball group acquired by the second imaging section provided when the second imaging section is provided among the second determination section and a third determination section configured to determine the quality of the solder ball group of the target object before being supplied to the target region based on image data of the solder ball group acquired by the third imaging section provided when the third imaging section is provided.

9. The quality determination device according to claim 8, wherein the second imaging device is provided in a transfer device configured to move a mounting head including the suction nozzle, and also serves as the first imaging device.

10. The quality determination device according to claim 8, wherein the third imaging device is fixed to a base of the component mounter, and images the solder ball group of the target object held by the suction nozzle from below.

11. The quality determination device according to claim 8, wherein at least the second determination section among the second determination section and the third determination section determines that the solder ball group is good when the number of the solder balls included in the solder ball group recognized by performing image processing on the image data of the solder ball group matches a predefined number of the solder balls to be supplied to the target region, and determines the solder ball group is defective when the number of the solder balls included in the recognized solder ball group is less than the predefined number.

12. The quality determination device according to claim 11, wherein the component mounter includes a supplement section configured to supply missing solder balls to the target region when at least the second determination section among the second determination section and the third determination section determines that the solder ball group is defective.

13. The quality determination device according to claim 12, wherein on the board, multiple mounting components configured to be subsequently conveyed to multiple component mounters and including the component are mounted, and the supplement section supplies the missing solder balls to the target region in the component mounter which has supplied the target object to the target region or the component mounter at a later stage than the component mounter.

14. A quality determination method applied to a component mounter including a pallet in which supply units are arranged, the supply unit on which a solder ball group that is multiple solder balls to be supplied to a target region that is at least a part of a mounting area of a component to be mounted on a board is mounted, the solder ball group being disposed in accordance with electrode positions of the component, and a suction nozzle configured to pick up and hold a target object that is the supply unit or the solder ball group mounted on the supply unit and supply the target object to the target region of the board, the quality determination method comprising:

a first determination step of determining quality of the solder ball group mounted on at least one supply unit among multiple supply units arranged in the pallet before the suction nozzle picks up the target object.

\* \* \* \* \*